US009883613B2

(12) United States Patent
Gao et al.

(10) Patent No.: US 9,883,613 B2
(45) Date of Patent: Jan. 30, 2018

(54) SUBRACK AND TERMINAL

(71) Applicant: ZTE CORPORATION, Guangdong (CN)

(72) Inventors: Yibing Gao, Guangdong (CN); Dongsheng Yao, Guangdong (CN); Fei Zhao, Guangdong (CN)

(73) Assignee: ZTE CORPORATION, Guangdong (CN)

(*) Notice: Subject to any disclaimer, the term of this patent is extended or adjusted under 35 U.S.C. 154(b) by 0 days.

(21) Appl. No.: 15/108,370

(22) PCT Filed: May 22, 2014

(86) PCT No.: PCT/CN2014/078194
§ 371 (c)(1),
(2) Date: Jun. 27, 2016

(87) PCT Pub. No.: WO2014/187349
PCT Pub. Date: Nov. 27, 2014

(65) Prior Publication Data
US 2016/0324035 A1 Nov. 3, 2016

(30) Foreign Application Priority Data
Dec. 27, 2013 (CN) .................... 2013 2 0877647 U

(51) Int. Cl.
H05K 7/20 (2006.01)
H04Q 1/02 (2006.01)
H01L 23/473 (2006.01)

(52) U.S. Cl.
CPC ......... *H05K 7/20572* (2013.01); *H04Q 1/025* (2013.01); *H04Q 1/035* (2013.01); *H05K 7/20145* (2013.01)

(58) Field of Classification Search
CPC . G06F 1/181–1/182; H05K 7/20218–7/20381;
(Continued)

(56) References Cited

U.S. PATENT DOCUMENTS

2004/0095723 A1* 5/2004 Tsai ........................ G06F 1/181
361/695
2005/0248922 A1* 11/2005 Chu .................... H05K 7/20727
361/700

(Continued)

FOREIGN PATENT DOCUMENTS

| CN | 101790291 | 7/2010 |
| CN | 203120361 | 8/2013 |
| WO | WO 2010/145069 | 12/2010 |

OTHER PUBLICATIONS

International Search Report for PCT/CN2014/078194, dated Aug. 6, 2014, 4 pages.

Primary Examiner — Anthony Haughton
Assistant Examiner — Razmeen Gafur
(74) Attorney, Agent, or Firm — Nixon & Vanderhye P.C.

(57) ABSTRACT

The present disclosure relates to a subrack and a terminal. The subrack includes a chassis, a first main board region arranged in a front part of the chassis, and a second main board region arranged at a rear of the chassis and also includes: a first air duct arranged in the chassis and a second air duct arranged in the chassis, where the second air duct and the first air duct are separated.

12 Claims, 4 Drawing Sheets

(58) Field of Classification Search
CPC ............. H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2006/0039107 A1* | 2/2006 | Kumano | ................. | G06F 1/181 361/690 |
| 2006/0044756 A1* | 3/2006 | Wong | ................. | G06F 1/20 361/695 |
| 2006/0087814 A1* | 4/2006 | Brandon | ............ | H05K 7/20563 361/694 |
| 2007/0127207 A1* | 6/2007 | Katakura | ............... | G11B 33/12 361/694 |
| 2007/0171607 A1* | 7/2007 | Tanaka | ................. | G11B 33/142 361/679.33 |
| 2007/0211428 A1* | 9/2007 | Doll | ................. | F04D 25/166 361/695 |
| 2008/0007911 A1* | 1/2008 | Hallin | ................. | G06F 1/181 361/679.47 |
| 2008/0106864 A1* | 5/2008 | Merino | ................. | G06F 1/181 361/688 |
| 2008/0225479 A1* | 9/2008 | Zieman | ................. | G06F 1/20 361/694 |
| 2008/0259563 A1* | 10/2008 | Fukuda | ................. | G06F 1/182 361/695 |
| 2010/0002382 A1* | 1/2010 | Aybay | ................. | H05K 7/20563 361/695 |
| 2010/0014248 A1* | 1/2010 | Boyden | ............. | H05K 7/20563 361/695 |
| 2010/0027216 A1* | 2/2010 | Matsushima | ...... | H05K 7/20745 361/679.49 |
| 2010/0097751 A1* | 4/2010 | Doll | ................. | G06F 1/20 361/679.47 |
| 2010/0097752 A1* | 4/2010 | Doll | ................. | G06F 1/20 361/679.48 |
| 2010/0263830 A1* | 10/2010 | Noteboom | ......... | H05K 7/20745 165/80.2 |
| 2011/0058330 A1* | 3/2011 | Abraham | ................. | G06F 1/20 361/679.47 |
| 2012/0173894 A1* | 7/2012 | Driggers | ................. | G06F 1/183 713/300 |
| 2013/0050923 A1* | 2/2013 | Wei | ................. | H05K 7/20745 361/679.5 |
| 2013/0063894 A1* | 3/2013 | Wang | ................. | H05K 7/1492 361/692 |
| 2013/0170132 A1* | 7/2013 | Bellin | ................. | G06F 1/20 361/679.46 |
| 2013/0201618 A1* | 8/2013 | Czamara | ................. | H05K 7/1497 361/679.5 |
| 2013/0258582 A1* | 10/2013 | Shelnutt | ................. | G06F 1/206 361/679.48 |
| 2013/0329364 A1* | 12/2013 | Kameno | ............. | H05K 7/20563 361/697 |
| 2014/0073234 A1* | 3/2014 | Elison | ................. | H05K 7/20727 454/184 |
| 2014/0211411 A1* | 7/2014 | Slaby | ................. | H05K 7/20745 361/679.46 |
| 2014/0223946 A1* | 8/2014 | Hall | ................. | H05K 7/20736 62/259.2 |
| 2014/0268547 A1* | 9/2014 | Kondo | ............. | H05K 7/20836 361/679.47 |

* cited by examiner

SUBRACK AND TERMINAL

CROSS-REFERENCES TO RELATED APPLICATIONS

This application is a United States national phase application of co-pending international patent application number PCT/CN2014/078194, filed on May 22, 2014 which claims priority to a Chinese patent application No. 201320877647.3 filed on Dec. 27, 2013, disclosures of both of which are incorporated herein by reference in their entireties.

TECHNICAL FIELD

The present disclosure relates to the field of communication, and particularly to a subrack and a terminal.

BACKGROUND

An existing subrack generally includes a chassis, a plurality of first main boards arranged in a front part of the chassis, and a plurality of second main boards arranged at a rear of the chassis. To facilitate heat dissipation of the subrack, a fan is usually installed at the rear of the subrack and an air inlet is arranged in the front part of the subrack. However, heat of the first main boards in the front part of the subrack is brought to the second main boards at the rear by such an air exhaustion manner, so that the second main boards at the rear are in a high-temperature environment for long, causing too fast ageing of the second main boards at the rear of the subrack and reducing device reliability.

This section provides background information related to the present disclosure which is not necessarily prior art.

SUMMARY

This section provides a summary of various of implementations or examples of the technology described in the disclosure, and is not a comprehensive disclosure of the full scope or all features in the disclosed technology.

To solve existing technical problems, embodiments of the present disclosure provide a subrack and a terminal.

Embodiments of the present disclosure provide a subrack which includes a chassis, a first main board region arranged in a front part of the chassis, and a second main board region arranged at a rear of the chassis and also includes:

a first air duct arranged in the chassis, wherein a first air inlet of the first air duct is arranged on a front wall of the chassis, the first air inlet and the first main board region are relatively arranged, and a first air outlet of the first air duct is arranged on a rear wall of the chassis; and a second air duct arranged in the chassis, wherein the second air duct and the first air duct are separated, a second air inlet of the second air duct is arranged on the front part wall of the chassis, the second air inlet is located below the first main board region and a second air outlet of the second air duct is arranged on the rear wall of the chassis.

Optionally, a first partition board for separating the first air inlet from the second air inlet is arranged between the first main board region and the second air inlet.

Optionally, the first main board region includes a plurality of first sub-main boards arranged horizontally; each of the plurality of first sub-main boards includes a PCB, a panel and a tray; a part of the panel located on an upper side of the PCB is provided with a first ventilation hole; a second ventilation hole is arranged between the PCB and the tray; the first ventilation hole and the second ventilation hole are communicated with the first air inlet; and the second ventilation hole is communicated with an adjacent first sub-main board through an opening in the tray.

Optionally, a back board is arranged between the first main board region and the second main board region, an opening communicated with the first air duct is formed in the back board, and the second air duct is arranged below the back board.

Optionally, the second main board region includes a plurality of second sub-main boards arranged longitudinally; a diversion board is inclined and arranged between the second main board region and a lower wall of the chassis; and the diversion board is communicated with the plurality of second sub-main boards for guiding air in the second air duct into the plurality of second sub-main boards.

Optionally, the subrack also includes:

a first air exhaustion device for driving air to be exhausted from the rear wall of the chassis, where the air enters the first air duct from the first air inlet, and then flows through the first main board region to the rear wall, wherein the first air exhaustion device is arranged on the rear wall of the chassis; and a second air exhaustion device for driving the air to be exhausted from the rear wall of the chassis, where the air enters the second air duct from the second air inlet, and flows through the second main board region to the rear wall;

wherein both of the first and second exhaustion device are arranged on the rear wall of the chassis, and the first air exhaustion is separated from the second exhaustion device.

Optionally, the first air exhaustion device includes a first sub-air exhaustion device, a second sub-air exhaustion device and a third sub-air exhaustion device; where the first sub-air exhaustion device is arranged above the second main board region, and the third sub-air exhaustion device is arranged below the second main board region; and the first sub-air exhaustion device, the second sub-air exhaustion device and the third sub-air exhaustion device surround the second main board region and are communicated in a C-shaped structure.

Optionally, the second air exhaustion device is arranged between the second main board region and the first sub-air exhaustion device, and a second partition board is arranged between the first sub-air exhaustion device and the second air exhaustion device.

Embodiments of the present disclosure also provide a terminal which includes the above subrack.

Embodiments of the present disclosure can achieve independent heat dissipation of the first main board region and the second main board region for avoiding mutual interference and accumulation of heat.

DETAILED DESCRIPTION

Figure 1:
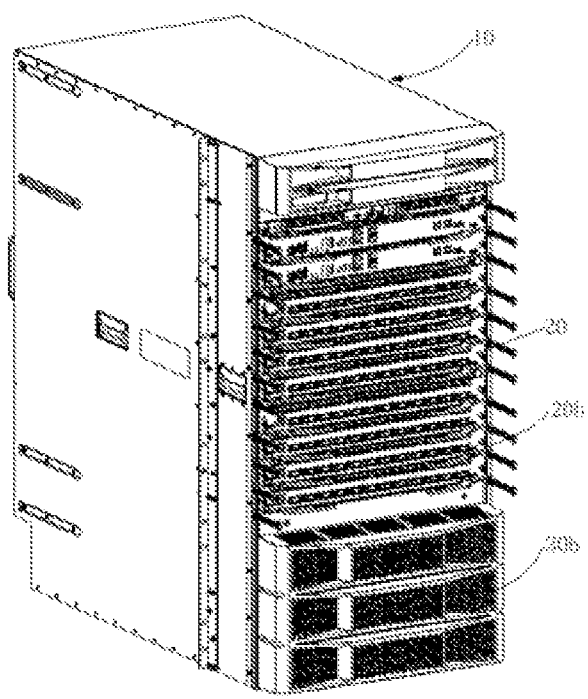
FIG. 1 is a structural diagram showing a subrack of embodiments of the present disclosure.

A structure and a principle of the present disclosure will be detailed below in combination with drawings. Described embodiments are only used for explaining the present disclosure, but are not intended to limit the protection scope of the present invention.

As shown in FIG. 1 to FIG. 5, embodiments of the present disclosure provide a subrack which includes a chassis 10, a first main board region 20 arranged in a front part of the chassis 10, and a second main board region 30 arranged at a rear of the chassis 10 and also includes:

a first air duct arranged in the chassis 10, wherein a first air inlet 20b of the first air duct is arranged on a front wall 11 of the chassis 10, the first air inlet 20b and the first main board region 20 are relatively arranged, and a first air outlet of the first air duct is arranged on a rear wall 12 of the chassis 10; and a second air duct arranged in the chassis 10, wherein the second air duct and the first air duct are separated, a second air inlet 30b of the second air duct is arranged on a front wall 11 of the chassis 10, the second air inlet 30b is located below the first main board region 20 and a second air outlet of the second air duct is arranged on a rear wall 12 of the chassis 10.

The first air duct used for cooling the first main board region and the second air duct used for cooling the second main board region are separated for achieving independent heat dissipation of the first main board region and the second main board region, thus mutual interference and accumulation of heat can be avoid. The first air duct and the second air duct adopt a front-in rear-out form and can prevent hot air from flowing back.

It should be explained that descriptions of words of "upper", "lower", "left", "right", "front", "rear" etc. about position relationships involved in present embodiments refer to those shown in the drawings.

In present embodiments, a first partition board (not shown in the drawings) for separating the first air inlet from the second air inlet is arranged between the first main board region 20 and the second air inlet.

Figure 2:
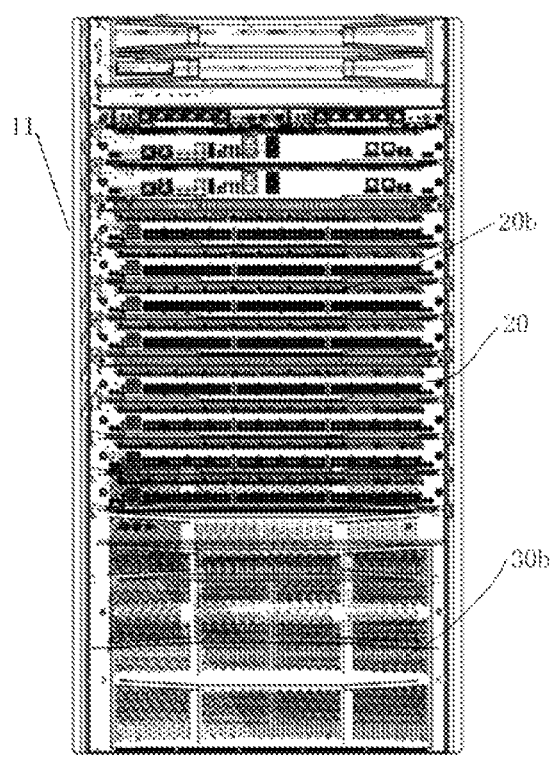
FIG. 2 is a front view showing a subrack of embodiments of the present disclosure.

As shown in FIG. 1 and FIG. 2, in present embodiments, the first main board region 20 includes a plurality of first sub-main boards arranged horizontally. The plurality of first sub-main board, located on the first main board region 20 and close to a lower wall of the chassis 10, can perform a function of separating the first air inlet from the second air inlet. But for preventing a ventilation hole or an installation crevice, etc. on the first sub-main board from influencing separation sealing performance of the first air inlet and the second air inlet, in present embodiments, the first partition board is adopted for separating the first air inlet from the second air inlet so as to avoid heat accumulation of the first main board region 20 and the second main board region 30.

In present embodiments, each of the plurality of first sub-main boards includes a PCB, a panel and a tray. A part of the panel located on an upper side of the PCB is provided with a first ventilation hole 31, and a second ventilation hole 32 is arranged between the PCB and the tray. The first ventilation hole 31 and the second ventilation hole 32 are communicated with the first air inlet 20b, and the second ventilation hole 32 is communicated with an adjacent first sub-main board through an opening in the tray.

Air which enters from the first ventilation hole 31 is used for cooling corresponding first sub-main boards, and air which enters from the second ventilation hole 32 is used for cooling an adjacent lower first sub-main board through an opening in the tray. An opening and a weather strip are arranged on the tray so that the air which enters from the second ventilation hole 32 can enter the adjacent lower first sub-main board.

An additional ventilation hole (the second ventilation hole 32) of the first sub-main boards can effectively increase air inlet area and improve a heat dissipation capability of a system.

In present embodiments, a back board 80 is arranged between the first main board region 20 and the second main board region 30, an opening communicated with the first air duct is formed in the back board 80, and the second air duct is arranged below the back board 80.

In present embodiments, the second main board region 30 includes a plurality of second sub-main boards arranged longitudinally. A diversion board 17 is inclined and arranged between the second main board region 30 and a lower wall of the chassis 10; and the diversion board 17 is communicated with the plurality of second sub-main boards so as to guide air in the second air duct into the plurality of second sub-main boards.

Gaps are provided among the plurality of first sub-main boards 20. The gaps form a part of the first air duct. The first partition board, the lower wall of the chassis 10 and the diversion board 17 form a part of the second air duct. The first air duct and the second air duct are mutually separated without mutual interference for avoiding heat accumulation of the first main board region 20 and the second main board region 30.

In present embodiments, the subrack also includes a first air exhaustion device and a second air exhaustion device. Both of the first and second exhaustion device are arranged on the rear wall 12 of the chassis 10, and the first air exhaustion is separated from the second exhaustion device.

The first air exhaustion device is configured for driving the air to be exhausted from a rear wall 12 of the chassis 10, where the air enters the first air duct from the first air inlet 20b, and then flows through the first main board region 20 to the rear wall 12.

The second air exhaustion device 70 is configured for driving the air to be exhausted from a rear wall 12 of the chassis 10, where the air enters the second air duct from the second air inlet 30b, and then flows through the second main board region 30 to the rear wall 12.

Figure 3:
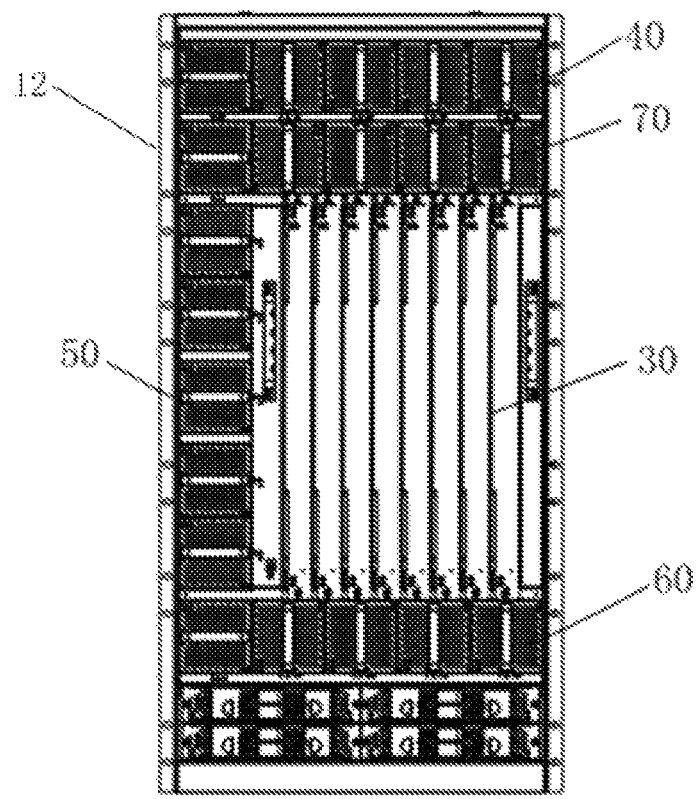
FIG. 3 is a back view showing a subrack of embodiments of the present disclosure.

The first air exhaustion device includes a first sub-air exhaustion device 40, a second sub-air exhaustion device 50 and a third sub-air exhaustion device 60; where the first sub-air exhaustion device 40 is arranged above the second main board region 30, and the third sub-air exhaustion device 60 is arranged below the second main board region 30. And the first sub-air exhaustion device 40, the second sub-air exhaustion device 50 and the third sub-air exhaustion device 60 which surround the second main board region 30 are communicated in a C-shaped structure, as shown in FIG. 3.

The first sub-air exhaustion device 40, the second sub-air exhaustion device 50 and the third sub-air exhaustion device 60, which are centralized in a C shape, have stronger heat dissipation capabilities and can be structurally realized more easily.

The air exhaustion device is arranged on the first air outlet of the first air duct, and the second air exhaustion device is arranged on the second air outlet of the second air duct.

The second air exhaustion device 70 is arranged between the second main board region 30 and the first sub-air exhaustion device 40, and a second partition board 18 is arranged between the first sub-air exhaustion device 40 and the second air exhaustion device 70.

The first air inlet 20b is opposite to a plurality of first main board regions 20. Cold air enters from the first air inlet 20b and cools the first sub-main boards in the first main board regions 20 through the first ventilation hole 31 and the second ventilation hole 32 on the plurality of first sub-main boards. After flowing through the first main board regions 20 and passing through the opening in the back board 80, the cold air turns into hot air, and the hot air is exhausted by the first sub-air exhaustion device 40, the second sub-air exhaustion device 50 and the third sub-air exhaustion device 60.

Figure 4:
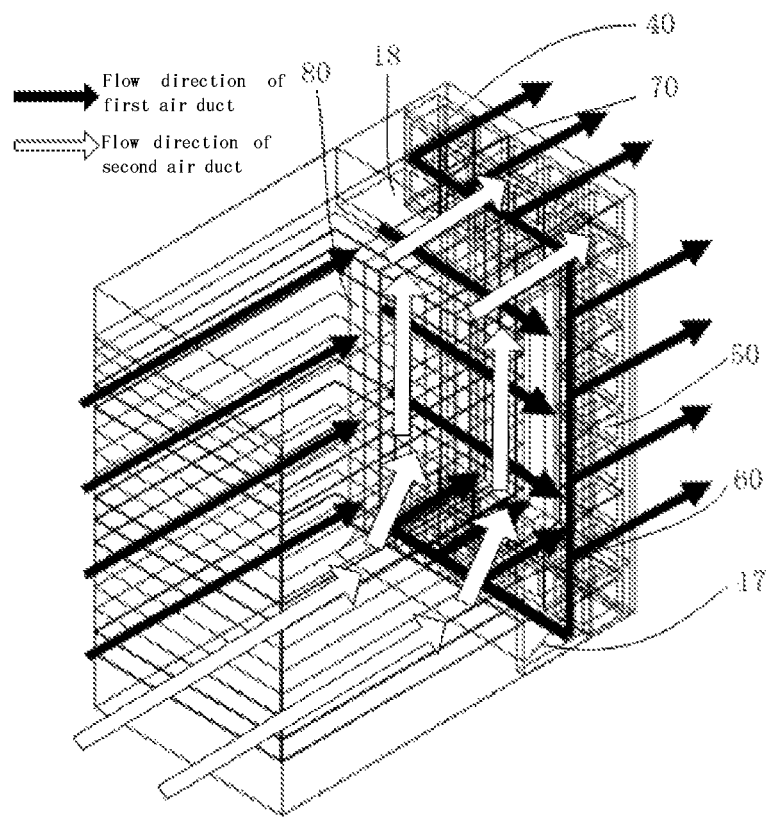
FIG. 4 is a schematic diagram showing air flow directions of a first air duct and a second air duct of a subrack of embodiments of the present disclosure.
Figure 5:
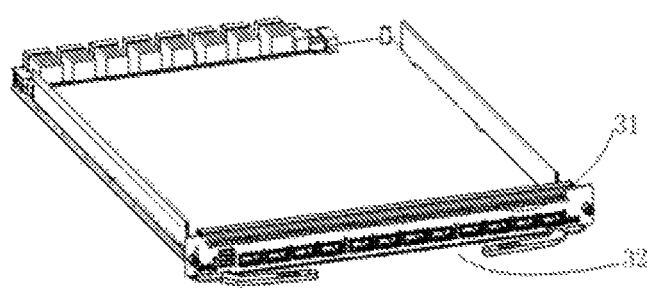
FIG. 5 is a structural diagram showing first sub-main boards of embodiments of the present disclosure.

The second air inlet 30b is arranged below the first main board region 20. The cold air enters from the second air inlet 30b, and then is diverted through the diversion board 17. After cooling the plurality of second sub-main boards, the cold air turns into hot air, and the hot air is exhausted by the second air exhaustion device 70. Air flow directions in the first air duct and the second air duct are shown in FIG. 4. Black arrows indicate air flow directions in the first air duct, and white arrows indicate air flow directions in the second air duct.

The subrack provided in embodiments of the present disclosure shortens a ventilation path and increases heat dissipation efficiency through a special structure of a first air exhaustion device, a second air exhaustion device, a first air duct and a second air duct. Thus, heat of the first main board region and the second main board region can be dissipated independently, and mutual interference and accumulation of heat can be avoid.

Embodiments of the present disclosure also provide a terminal which includes the subrack in above embodiments.

Above descriptions are preferred embodiments of the present disclosure. It should be noted that, for those ordinary skilled in the art, several modifications and polishes may also be made without departing from technical principles described in the present disclosure, and these modifications and polishes should also be deemed to be fallen into the protection scope of the present disclosure.

The invention claimed is:

1. A subrack, comprising
a chassis;
a first main board region arranged in a front part of the chassis;
a second main board region arranged at a rear of the chassis;
a first air duct arranged in the chassis, wherein a first air inlet of the first air duct is arranged on a front wall of the chassis, the first air inlet and the first main board region are oppositely arranged, and a first air outlet of the first air duct is arranged on a rear wall of the chassis; and
a second air duct arranged in the chassis, wherein the second air duct and the first air duct are separated, a second air inlet of the second air duct is arranged on the front wall of the chassis, the second air inlet is located below the first main board region, and a second air outlet of the second air duct is arranged on the rear wall of the chassis;
wherein a first partition board for separating the first air inlet from the second air inlet is arranged between the first main board region and the second air inlet;
wherein the first main board region comprises a plurality of first sub-main boards arranged horizontally; each of the plurality of first sub-main boards comprises a PCB, a panel and a tray; a part of the panel located on an upper side of the PCB is provided with a first ventilation hole; a second ventilation hole is arranged between the PCB and the tray; the first ventilation hole and the second ventilation hole are communicated with the first air inlet; and the second ventilation hole is communicated with an adjacent first sub-main board through an opening in the tray.

2. The subrack according to claim 1, wherein a back board is arranged between the first main board region and the second main board region, an opening communicated with the first air duct is formed in the back board, and the second air duct is arranged below the back board.

3. The subrack according to claim 2, wherein the second main board region comprises a plurality of second sub-main boards arranged longitudinally; a diversion board is inclined and arranged between the second main board region and a lower wall of the chassis; and the diversion board is communicated with the plurality of second sub-main boards for guiding air in the second air duct into the plurality of second sub-main boards.

4. The subrack according to claim 3, further comprising:
a first air exhaustion device for driving air to be exhausted from the rear wall of the chassis, where the air enters the first air duct from the first air inlet, and then flows through the first main board region to the rear wall, wherein the first air exhaustion device is arranged on the rear wall of the chassis; and
a second air exhaustion device for driving the air to be exhausted from the rear wall of the chassis, where the air enters the second air duct from the second air inlet, and flows through the second main board region to the rear wall;
wherein both of the first and second exhaustion device are arranged on the rear wall of the chassis, and the first air exhaustion is separated from the second exhaustion device.

5. The subrack according to claim 4, wherein the first air exhaustion device comprises a first sub-air exhaustion device, a second sub-air exhaustion device and a third sub-air exhaustion device; where the first sub-air exhaustion device is arranged above the second main board region, and the third sub-air exhaustion device is arranged below the second main board region; and the first sub-air exhaustion device, the second sub-air exhaustion device and the third sub-air exhaustion device surround the second main board region and are communicated in a C-shaped structure.

6. The subrack according to claim 4, wherein the second air exhaustion device is arranged between the second main board region and the first sub-air exhaustion device, and a second partition board is arranged between the first sub-air exhaustion device and the second air exhaustion device.

7. A terminal, comprising a subrack, wherein the subrack comprises
a chassis;
a first main board region arranged in a front part of the chassis;
a second main board region arranged at a rear of the chassis;
a first air duct arranged in the chassis, wherein a first air inlet of the first air duct is arranged on a front wall of the chassis, the first air inlet and the first main board region are oppositely arranged, and a first air outlet of the first air duct is arranged on a rear wall of the chassis; and
a second air duct arranged in the chassis, wherein the second air duct and the first air duct are separated, a second air inlet of the second air duct is arranged on the front wall of the chassis, the second air inlet is located below the first main board region, and a second air outlet of the second air duct is arranged on the rear wall of the chassis;

wherein a first partition board for separating the first air inlet from the second air inlet is arranged between the first main board region and the second air inlet;

wherein the first main board region comprises a plurality of first sub-main boards arranged horizontally; each of the plurality of first sub-main boards comprises a PCB, a panel and a tray; a part of the panel located on an upper side of the PCB is provided with a first ventilation hole; a second ventilation hole is arranged between the PCB and the tray; the first ventilation hole and the second ventilation hole are communicated with the first air inlet; and the second ventilation hole is communicated with an adjacent first sub-main board through an opening in the tray.

8. The terminal according to claim 7, wherein, in the subrack, a back board is arranged between the first main board region and the second main board region, an opening communicated with the first air duct is formed in the back board, and the second air duct is arranged below the back board.

9. The terminal according to claim 8, wherein, in the subrack, the second main board region comprises a plurality of second sub-main boards arranged longitudinally; a diversion board is inclined and arranged between the second main board region and a lower wall of the chassis; and the diversion board is communicated with the plurality of second sub-main boards for guiding air in the second air duct into the plurality of second sub-main boards.

10. The terminal according to claim 9, wherein the subrack further comprises a first air exhaustion device for driving air to be exhausted from the rear wall of the chassis, where the air enters the first air duct from the first air inlet, and then flows through the first main board region to the rear wall, wherein the first air exhaustion device is arranged on the rear wall of the chassis; and a second air exhaustion device for driving the air to be exhausted from the rear wall of the chassis, where the air enters the second air duct from the second air inlet, and flows through the second main board region to the rear wall;

wherein both of the first and second exhaustion device are arranged on the rear wall of the chassis, and the first air exhaustion is separated from the second exhaustion device.

11. The terminal according to claim 10, wherein, in the subrack, the first air exhaustion device comprises a first sub-air exhaustion device, a second sub-air exhaustion device and a third sub-air exhaustion device; where the first sub-air exhaustion device is arranged above the second main board region, and the third sub-air exhaustion device is arranged below the second main board region; and the first sub-air exhaustion device, the second sub-air exhaustion device and the third sub-air exhaustion device surround the second main board region and are communicated in a C-shaped structure.

12. The terminal according to claim 10, wherein, in the subrack, the second air exhaustion device is arranged between the second main board region and the first sub-air exhaustion device, and a second partition board is arranged between the first sub-air exhaustion device and the second air exhaustion device.

* * * * *